United States Patent [19]

Nakano et al.

[11] 4,382,194
[45] May 3, 1983

[54] BOOSTING CIRCUIT

[75] Inventors: Masao Nakano, Kawasaki; Fumio Baba, Yokohama; Hirohiko Mochizuki, Tokyo, all of Japan

[73] Assignee: Fujitsu Limited, Kawasaki, Japan

[21] Appl. No.: 213,398

[22] Filed: Dec. 5, 1980

[30] Foreign Application Priority Data

Dec. 5, 1979 [JP] Japan .................. 54-157751

[51] Int. Cl.³ .................. H03K 4/24; H03K 5/01
[52] U.S. Cl. .................. 307/264; 307/482; 307/578
[58] Field of Search ........... 307/264, 482, 578, 296 A, 307/304, 269

[56] References Cited

U.S. PATENT DOCUMENTS

| | | | |
|---|---|---|---|
| 3,646,369 | 2/1972 | Fujimoto | 307/482 |
| 3,988,617 | 10/1976 | Price | 307/482 |
| 4,061,929 | 12/1977 | Asano | 307/296 A |
| 4,071,783 | 1/1978 | Knepper | 307/482 |
| 4,330,719 | 5/1982 | Nagami | 307/578 |

Primary Examiner—John Zazworsky
Attorney, Agent, or Firm—Staas & Halsey

[57] ABSTRACT

A boosting circuit boosts a voltage of a load capacitor which is charged by a specific voltage. The boosting circuit comprises a boosting capacitor one end of which is connected to receive a clock signal, a charging circuit for charging the boosting capacitor, a gate circuit provided between the load capacitor and the other end of the boosting capacitor, and a gate control circuit for opening the gate circuit upon discharging of the charge of the boosting, that is controlled by the clock signal, to the load capacitor and for closing the gate circuit during discharging of the load capacitor. The charging circuit is provided separately from a circuit for supplying the specific voltage. The charges of the boosting capacitor under the control of the clock signal flow through the gate circuit to the load capacitor.

19 Claims, 7 Drawing Figures

BOOSTING CIRCUIT

BACKGROUND OF THE INVENTION

The present invention relates to boosting circuits, and more particularly to a boosting circuit which boosts or shifts up a level of a clock signal and derives a boosted clock signal having a voltage higher than a power source voltage.

The power source voltage used for an integrated circuit (IC) was selected at 12 volts, for example. However, there is a recent tendency to lower the power source voltage to 7 volts or 5 volts etc. This tendency is increased by improvements in the performance of transistors, the necessity of matching the levels of transistor-transistor logic (TTL) circuits, etc. In order to speed up the operational speeds of IC memories operated by the lowered voltage, it is necessary to employ a circuit for boosting or shifting up the level of the clock signal.

The conventional boosting circuit connected to a word line driver, for example, comprises a boosting capacitor having one end connected to the word line and the other end is connected to a clock signal. A load capacitor, such as a stray capacitance of the word line driving circuit, is charged up to the power source voltage ($V_{DD}$) by an output clock signal from a driver. When the boosting capacitor which has already been charged by the driver, receives the clock signal, the charges of the boosting capacitor are transferred to the load capacitor thereby shifting upward the voltage of the load capacitor.

As will be described hereinafter in conjunction with drawings, the value of the boosted voltage of the load capacitor is determined by the ratio of the capacitances of the boosting and load capacitors. In order to obtain the desired voltage, the larger the capacitance of the load capacitor is, the larger the capacitance of the boosting capacitor should be.

In the conventional circuit, the boosting capacitor is considered to be a load together with the load capacitor for the driver, since the driver charges the boosting capacitor. Accordingly, in a case where the capacitances of the boosting and load capacitors are equal, for example, the driver should drive a total load which is twice as much as the load capacitor above. This results in a voltage waveform that is deformed and rounded, so that the operational speed of the memory becomes slow when the load is the word line driving circuit.

SUMMARY OF THE INVENTION

Accordingly, it is a general object of the present invention to provide a novel and useful boosting circuit in which the above-described difficulties have been overcome.

Another and specific object of the present invention is to provide a boosting circuit having a charging circuit for charging a boosting capacitor which is provided separately from the driver, wherein the boosting capacitor does not act as a load for the driver.

A further object of the present invention is to provide a boosting circuit having a gate circuit connected between a boosting capacitor and a load capacitor and a gate control circuit, including a capacitor, for controlling the opening and closing of the gate circuit. The capacitor of the gate control circuit may be of a small capacitance value.

Other objects and further features of the invention will be apparent from the following detailed description, with respect to preferred embodiments of the invention, when read in conjunction with the accompanying drawings.

DETAILED DESCRIPTION OF THE PREFERRED EMBODIMENTS

Figure 1:
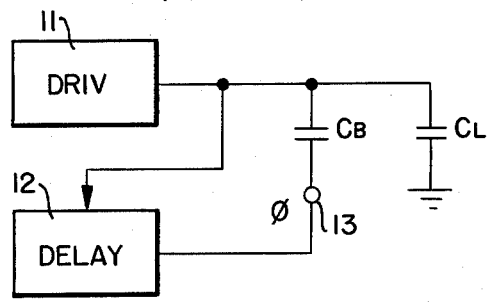
FIG. 1 is a circuit diagram of an example of a conventional boosting circuit.

Referring to FIG. 1, a description is first given of a conventional boosting circuit. A load capacitor CL such as a stray capacitance of a word line driving circuit is charged up to a voltage equal to the power source voltage ($V_{DD}$) by an output clock signal of a drive 11. A boosting capacitor CB is also charged by the output clock signal of the driver 11. The output clock signal of the driver 11 is connected to a delay circuit 12 which generates a clock signal $\phi$. The clock signal $\phi$ is connected to the boosting capacitor CB through a terminal 13, whereby the charges of the boosting capacitor CB flow into the load capacitor CL. Accordingly, the voltage V of the load capacitor CL is boosted or shifted up to a voltage higher than the voltage of the output clock signal of the driver 11. The amount of this voltage boosting is determined by th voltage V1 of the clock signal $\phi$ and the ratio of the capacitances Cb and Cl of the boosting and load capacitors CB and CL as given by the equation:

$$\frac{Cb}{Cl + Cb} V1.$$

For example, if it is assumed that the capacitances Cb and Cl of the capacitors CB and CL are equal to each other, namely Cb=Cl, the voltage V of the load capacitor is boosted by ½V1 and becomes 3/2 V1.

However, since the boosting capacitor CB is directly connected to the driver 11 and charged by the clock signal $\phi$ from the driver, the boosting capacitor CB acts as a load for the driver 11. Therefore, in the example of Cb=Cl, the driver 11 must drive a load twice as much as the load capacitor CL alone. This causes the disadvantage that the voltage waveform of the clock signal is deformed and rounded, so that the operation speed of the memory becomes slow.

Figure 2:
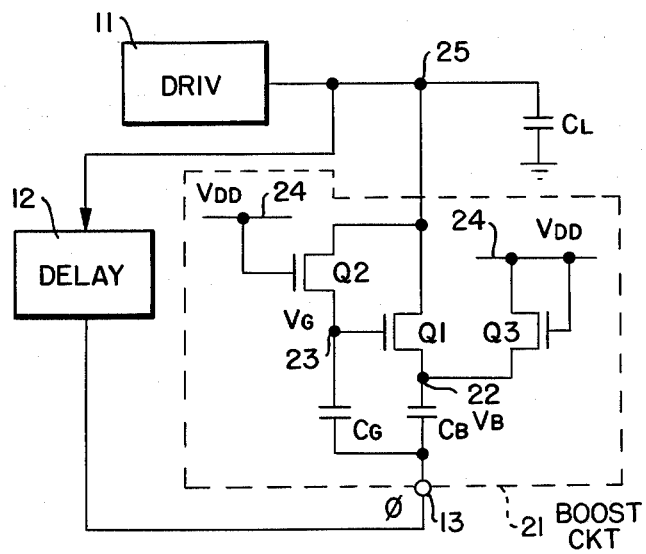
FIG. 2 is a circuit diagram of a first embodiment of a boosting circuit of the present invention.

The boosting circuit of the present invention overcomes the above-described disadvantages of the conventional boosting circuit. In FIG. 2, the parts which correspond to those in FIG. 1 are designated by like reference numerals, and the descriptions thereof will not be repeated.

The boosting capacitor CB is connected, through a transistor Q1, to the output side of the driver 11 and the load capacitor CL. A connecting point 22 between the boosting capacitor CB and the transistor Q1 is connected to a line 24 of the power source voltage $V_{DD}$ through a transistor Q3, the gate and drain electrodes of the transistor Q3 are connected to the line 24. Another capacitor CG is connected between the terminal 13 and the gate electrode of the transistor Q1. Between the output side of the driver 11 and a connecting point 23 between the capacitor CG and the gate of the transistor Q1, is connected a transistor Q2 having a gate electrode connected to the power source line 24.

During the time when the clock signal $\phi$ is not applied to the terminal 13 and the voltage at the terminal 13 is a low level (0V), the boosting capacitor CB is charged through the transistor Q3 by the power source voltage $V_{DD}$ from the line 24. A voltage VB at the point 22 is then approximately equal to the power source voltage $V_{DD}$, or precisely equal to a voltage ($V_{DD}$−Vth3), where Vth3 denotes a threshold voltage of the transistor Q3. This voltage VB is shown by a line I in FIG. 3. The load capacitor CL is charged by the output clock signal voltage of the driver 11. The voltage of the load capacitor CL then becomes equal to the power source voltage $V_{DD}$, as shown by a curve II in FIG. 3.

The transistor Q2, having a gate supplied with the power source voltage $V_{DD}$ is in an ON state. Accordingly, the capacitor CG is charged through the transistor Q2 by the output clock signal of the driver 11. A voltage VG at the point 23 is then approximately equal to the power source voltage $V_{DD}$, or precisely equal to a voltage ($V_{DD}$−Vth2), wher Vth2 denotes a threshold voltage of the transistor Q2. This voltage VG is shown by a curve III in FIG. 3. Practically, the voltages Vth2 and Vth3 are equal to each other, and therefore denoted by Vth in FIG. 3.

In a state where the capacitors CB and CG are charged up as described above, there is no current flowing through the transistors Q2 and Q3 in their ON states, since the voltage difference between the source and gate electrodes of each of the transistors is not more than the threshold voltage Vth. During this time interval, the transistor Q1 is in an OFF state, and accordingly no current flows through the transistor Q1.

As described above, the boosting capacitor CB is not charged by the output clock signal of the driver 11, but is charged by the power source voltage $V_{DD}$ from the line 24 throught the transistor Q3. Accordingly, the boosting capacitor CB does not burden the driver 11 as a load, so that the load capacitor CL can be charged quickly.

On the other hand, the capacitor CG seems to be a load for the driver 11. However, the capacitor CG is used only for increasing the gate voltage of the transistor Q1. The capacitance value of the capacitor CG may be extremely small to the extent of one hundredth of the capacitance value of the capacitor CB. The capacitance of the capacitor CG is 0.1 PF, while the capacitance of the capacitor CB is 10 PF, for example. Therefore, the load of the capacitor CG on the driver 11 is almost negligible.

Next, the clock signal $\phi$ from the delay circuit 12 is applied to the terminal 13. The clock signal $\phi$ has a voltage waveform shown by curve IV in FIG. 3, of which maximum voltage is $V_{DD}$. The voltages of the capacitors CB and CG are then shifted up towards $2V_{DD}$.

Since the voltage at the point 23 is shifted up towards $2V_{DD}$ by shifting up of the voltage of the capacitor CG, the transistor Q1 turns on. The transistors Q2 and Q3 turn off when the voltages VB and VG at the points 22 and 23 exceed the voltage $V_{DD}$. A part of the charge stored in the capacitor CB is discharged to the load capacitor CL through the transistor Q1 which is in the ON state, so that the voltage of the load capacitor CL, namely the voltage at a point 25, is boosted. For example, the voltage at the point 25 is boosted up to 3/2 $V_{DD}$, when the capacitance Cb equals the capacitance Cl. Thus, the boosting or shifting up of the voltage of the output clock signal from the driver 11 is performed.

Figure 3:
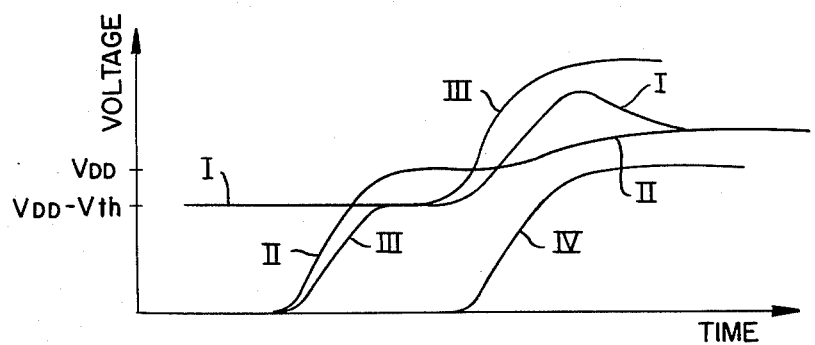
FIG. 3 is graph showing waveforms of voltages at respective parts in the circuit diagram of FIG. 2.

Here, as shown in FIG. 3, in accompaniment with the clock signal $\phi$, the voltage VG at the point 23 increases as shown by the curve III, while the voltage VB at the point 22 decreases to the voltage $$\left(\frac{3}{2} V_{DD}\right)$$

equal to the voltage at the point 25 after increasing as shown by the curve I, due to turn on of the transistor Q1 and discharge of the boosting capacitor CB. The driver 11 is so constructed as to obstruct the flow of charge from the boosting capacitor CB into the driver 11, during discharge of the boosting capacitor CB.

When the level of the output clock signal from the driver 11 is low, the charge of the load capacitor CL flows into the driver 11 and is discharged therethrough, whereby the voltage of the load capacitor CL decreases. The charge of the capacitor CG also flows into the driver 11 through the transistor Q2 and are discharged therethrough, so that the voltage VG at the point 23 decreases and turns off the transistor Q1. During the interval that the level of the clock from the driver 11 is low, the DC current does not flow from the line 24 of the power source voltage $V_{DD}$ to the driver 11 through the transistors Q3 and Q1, since the transistor Q1 is in the OFF state as described above.

Figure 4:
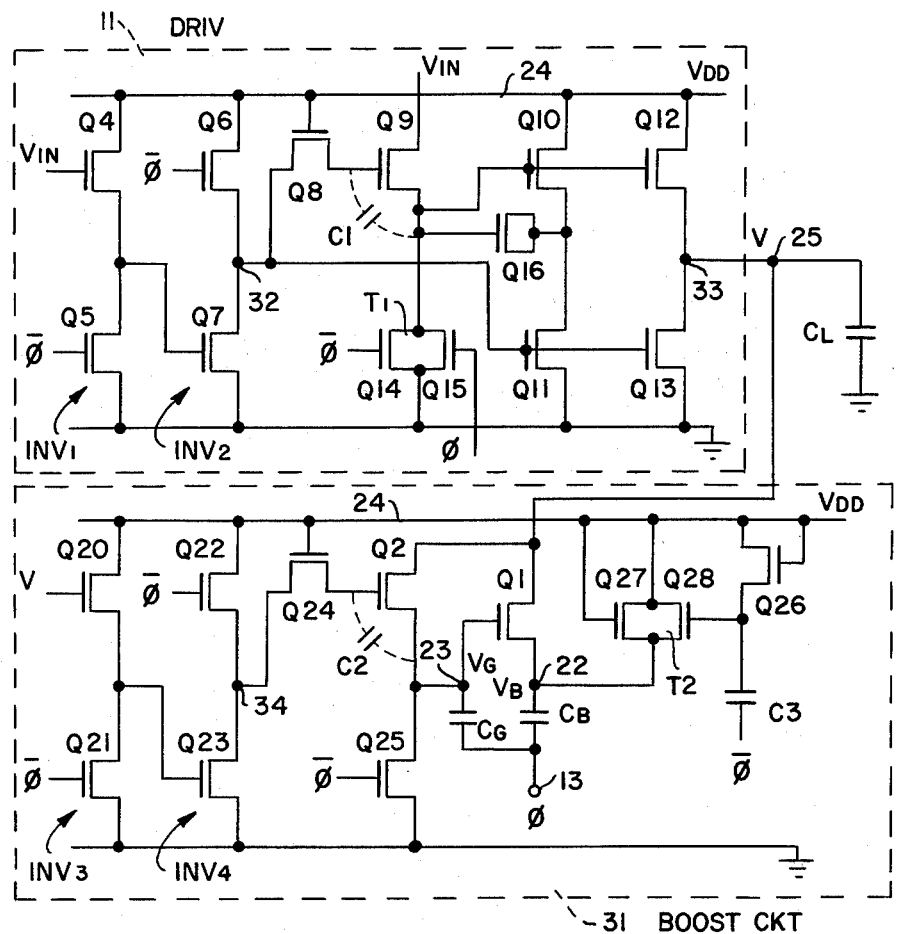
FIG. 4 is a circuit diagram of a second embodiment of the boosting circuit of the present invention.

Next, the second embodiment of the boosting circuit of the present invention in a more complicated form will be described in conjunction with FIG. 4. In FIG. 4, the parts which correspond to those in FIG. 2 are designated by like reference numerals.

The driver 11 comprises transistors Q4 through Q16. The transistor Q4 and Q5 comprise a first stage inverter INV1, and the transistor Q6 and Q7 comprise a second stage inverter INV2. In the initial state, the inverters INV1 and INV2 have been reset by a clock signal $\bar{\phi}$ applied to the gates of the transistors Q5 and Q6. In this state, the transistors Q5 and Q6 are in the ON state, and a voltage at a point 32 between the transistors Q6 and Q7 is at a high level. The transistors Q11 and Q13 of which gate electrodes are connected with the voltage at the point 32 are in the ON state. An output point 33 of the driver 11 is grounded through the transistor Q13, so that the output point 33 is at the low level. The transistor Q8 is also in the ON state, whereby a capacitor Cl connected between the gate and source electrodes of the transistor Q9 is charged to the high level through the transistor Q8.

When a clock signal $V_{IN}$ applied to the gate of the transistor Q4 from an external circuit becomes the high level and, at the same time, the clock signal $\bar{\phi}$ becomes the low level, the transistor Q4 turns on, the transistors Q5 and Q6 turn off, and the transistor Q7 turns on. The voltage at the point 32 beomes the low level, so that the transistor Q11 and Q13 respectively assume the OFF states.

Figure 5:
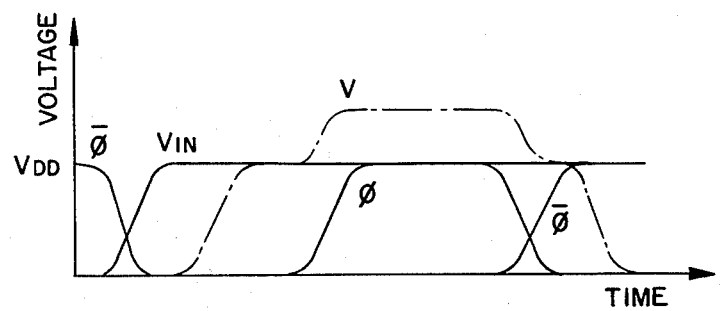
FIG. 5 is a graph showing waveforms of voltages at respective parts in the circuit diagram of FIG. 4.

As shown in FIG. 5, there is a time difference between the falling-down of the clock $\bar{\phi}$ and the rising-up of the clock $\phi$. A gate T1 consists of the transistors Q14 and Q15 of which gate electrodes are respectively applied with the clock signal $\bar{\phi}$ and $\phi$. Immediately after the voltage of the clock signal $\bar{\phi}$ falls down, the transistors Q14 and Q15 are both in the OFF state. When the voltage of the clock signal $V_{IN}$ applied to the drain electrode of the transistor Q9 becomes the high level, this voltage is applied to the transistors Q10 and Q12 through the transistor Q9, so that the transistors Q10 and Q12 turn on. The voltage V of the output clock signal of the driver 11 rises up as shown by a single-dot chain line in FIG. 5 and charges the load capacitor CL.

A boosting circuit 31 comprises the transistors Q1 and Q2, transistors Q20 through Q28, and the capacitors CB and CG. The transistors Q20 and Q21 constitute a first stage inverter INV3, and the transistors Q22 and Q23 constitute a second stage inverter INV4. In the initial state, the clock signal $\bar{\phi}$ of the high level is applied to the gates of the transistors Q21 and Q22, whereby the transistors Q21 and Q22 are placed in the ON state, and a voltage at a point 34 between the transistors Q22 and Q23 is at the high level. After the voltage of the clock signal $\bar{\phi}$ falls down to the low level, and when the voltage V of the output clock signal of the driver 11 which is applied to the gate electrode of the transistor Q20 rises up, the voltage at the point 34 becomes the low level.

When the voltage at the point 34 and the voltage of the clock signal $\bar{\phi}$ are high, a capacitor C2 connected between the gate and source electrodes of the transistor Q2 is charged to the high level through the transistor Q24. The transistor Q2 goes to the ON state. After the voltage of the clock signal $\bar{\phi}$ becomes the low level turning the transistor Q25 off, and when the voltage V of the output clock signal of the driver 11 rises up, the capacitor CG is charged by the output voltage V of the driver 11 through the transistor Q2. The voltage of the gate electrode of the transistor Q2 has a higher value due to a boot strap effect of the capacitor C2. Accordingly, the voltage VG at the point 23 becomes equal to the voltage $V_{DD}$ (V) in this embodiment, while the voltage at the point 23 is $V_{DD}-Vth$ in the first embodiment in FIG. 3.

A transmission gate T2 comprises the transistors Q27 and Q28. The transistors Q26 and Q28 correspond to the transistor Q3 of the first embodiment in FIG. 2. When the clock signal $\phi$ applied to the gate electrode of the transistor Q28 of the gate T2 through a capacitor C3 is at the high level, the boosting capacitor CB is charged by the power source voltage $V_{DD}$ from the line 24 through the gate T2. The voltage of the gate electrode of the transistor Q28 has a higher value due to a boot strap effect of the capacitor C3. Accordingly, the voltage VB at the point 22 becomes equal to the voltage $V_{DD}$ in this embodiment. In this state, the voltage VB at the point 22 equals the voltage $V_{DD}$, the voltage VG at the point 23 equals the voltages V and $V_{DD}$. The transistor Q1 is in the OFF state. After completion of the charging of the boosting capacitor CB, the level of the clock signal $\bar{\phi}$ decreases to the low level, so that the transistor Q28 turns off, thereby turning the gate T2 off.

When the voltage of the clock signal $\phi$ applied to the terminal 13 rises up, the transistor Q1 turns on, and the charges of the boosting capacitor CB flow through the transistor Q1 to the load capacitor CL, so that the voltage of the load capacitor CL, i.e., the voltage at the point 25, is boosted. During discharging of the boosting capacitor CB, through the transistor Q1, the gate T2 is in the OFF state, so that discharging from the boosting capacitor CB through the gate T2 to the line 24 is prevented.

In the driver 11, the transistor Q13 is in the OFF state as described above. Further, the transistor Q9 is in the OFF state since the voltage of the gate electrode of the transistor Q9 has a lower value due to the lower voltage at the point 32, and the transistor Q15 of which the gate is applied with the clock signal $\phi$ is in the ON state. Consequently the transistor Q12 is in the OFF state. Accordingly, no current flows into the driver 11 from the point 25 side.

Thereafter, when the voltage of the clock signal $V_{IN}$ falls down and the voltage of the clock signal $\bar{\phi}$ rises up, the voltage at the point 32 becomes high and causes the transistors Q11 and Q13 to assume the ON states and the transistors Q10 and Q12 to assume the OFF states. The charges of the capacitor CL are discharged through the transistor Q13 which is in the ON state, so that the voltage V at the point 25 decreases. At that time, the charges of the capacitor CG are discharged through the transistor Q2, point 25, and transistor Q13, so that the transistor Q1 is turned off.

After the transistor Q1 assumes the OFF state, the voltage of the clock $\phi$ rises up again. Then, the transistor Q28 turns on again, and the boosting capacitor CB is charged again through the gate T2 from the line 24.

In this embodiment, the gate electrode of the transistor Q2 is not connected directly to the $V_{DD}$ line 24, but connected through the transistor Q24 to the output point 34 of the inverter INV4. Accordingly, when the voltage of the clock signal $\phi$ becomes low, the voltage of the gate electrode of the transistor Q2 increases over the power source voltage $V_{DD}$, whereby the voltage drop across the transistor Q2 becomes substantially null. The charged voltage VG of the capacitor CG at the point 23 can be thereby increased to the voltage V, and therefore the capacitance value of the capacitor CG may be smaller since the above-described charged voltage VG increases. The small capacitance value of the capacitor CG lessens the burden on the driver 11.

Figure 6:
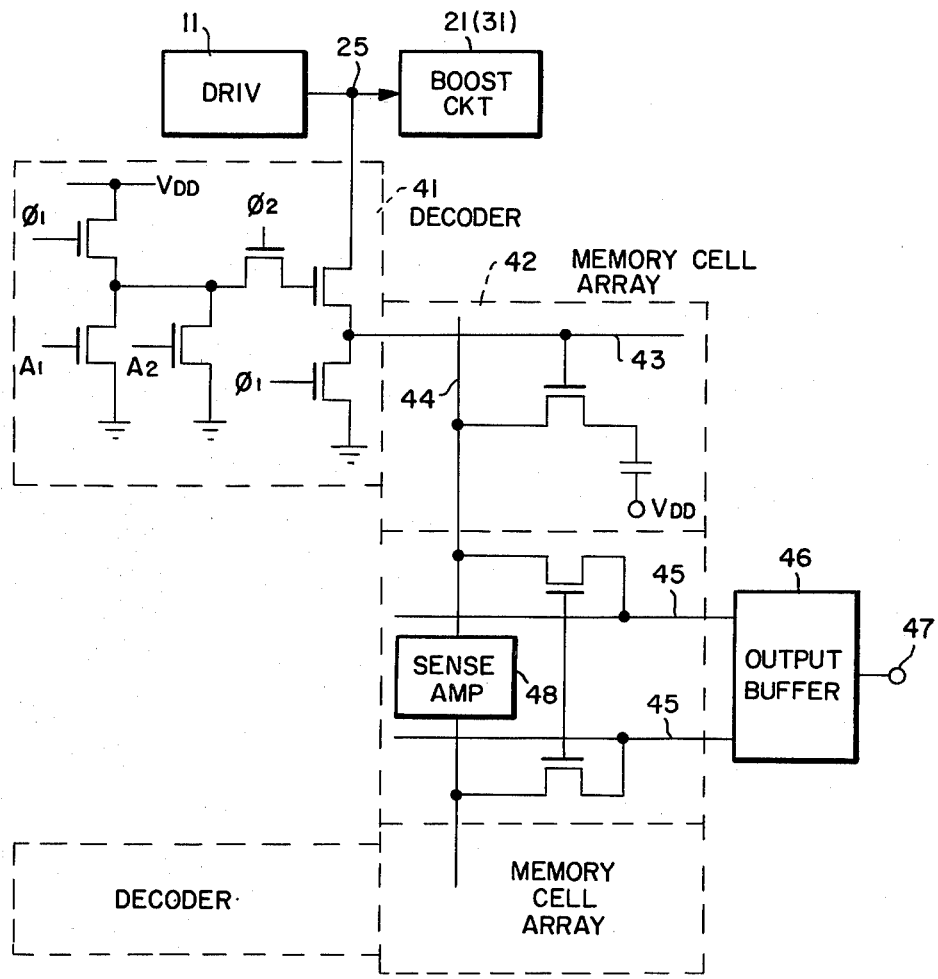
FIG. 6 is a circuit diagram of an example of a memory device connected to the boosting circuit of the present invention.

An example of a memory device which is connected to the boosting circuit 21 or 31 of the present invention is briefly described in conjunction with FIG. 6. The voltage of the clock signal from the driver 11 is boosted by the boosting circuit 21 or 31, as described above. The boosted clock signal at the point 25 is supplied through a decoder 41 to a word line 43 in a memory cell array 42 to boost the level of the word line 43. A voltage at a cross point of the addressed word line 43 and a bit line 44 is amplified by a sense amplifier 48 and thereafter sent out through a data bus 45, an output buffer 46, and an output terminal 47.

Figure 7:
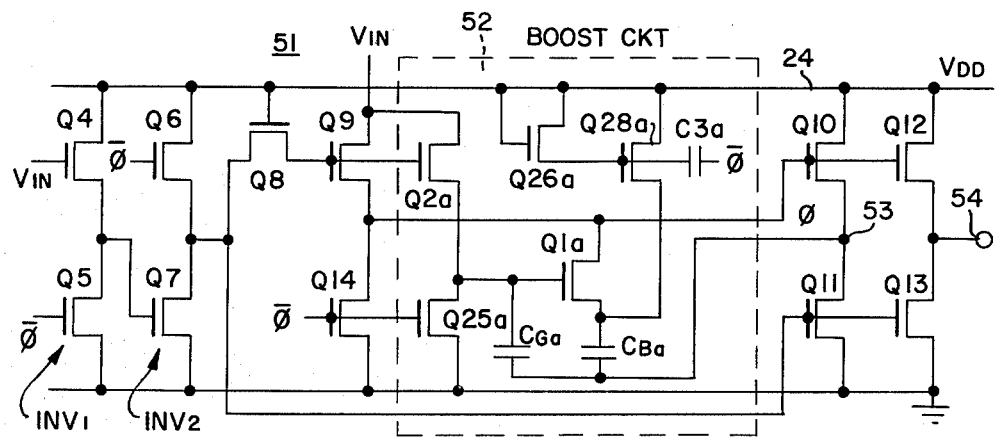
FIG. 7 is a circuit of an embodiment of a driver containing the boosting circuit of the present invention.

Another embodiment of the boosting circuit of the present invention applied to the driver is next described in conjunction with FIG. 7. In FIG. 7, the parts which corresponds to those in FIG. 4 are designated by like reference numerals, and the descriptions thereof will not be repeated.

In FIG. 4 transistor Q16 functions as a bootstrap capacitor which provides a sufficiently high potential at the gates of transistors Q10 and Q12, so that the power source voltage VDD is supplied through transistor Q12 without a substantial potential drop thereacross. In FIG. 7 a driver 51 of the present embodiment is obtained by replacing the transistor Q16 for a boot strap capacitance in the driver 11 by a boosting circuit 52. The circuit construction of the boosting circuit 52 is the same as the essential part of the boosting circuit 31 in FIG. 4. Transistors Q1a, Q2a, Q25a, Q26a, and Q28a, and capacitors CBa, CGa, and C3a in FIG. 7 correspond to transistors Q1, Q2, Q25, Q26, and Q28, and capacitors CB, CG, and C3, respectively. The operation of the boosting circuit 52 is the same as that of the essential part of the boosting circuit 31, and therefore the detailed description is omitted. The boosting capacitor CBa is charged through the transistor Q28a by the power source voltage $V_{DD}$ from the line 24. The capacitor CGa is charged through the transistor Q2a. When the boosting capacitor CGa is applied with the clock signal $\phi$ from a point 53 between the transistors Q10 and Q11, the transistor Q1a turns on, and the charges of the boosting capacitor CBa flow to the transistors Q10 and Q12 which correspond to a load capacitor. Accordingly, the boosted or level shifted up clock signal is derived from an output terminal 54.

Further, this invention is not limited to these embodiments but various variations and modifications may be made without departing from the scope of the invention.

What we claim is:

1. A boosting circuit, operatively connectable to receive a clock signal $\phi$ and including a circuit for generating a specific voltage, for boosting a voltage of a load capacitance which is charged to the specific voltage, said boosting circuit comprising:
   a boosting capacitance, one end of which is operatively connectable to receive the clock signal $\phi$;
   a charging circuit, operatively connected to the other end of said boosting capacitance, for charging said boosting capacitance, said charging circuit being provided separately from the circuit for generating the specific voltage;
   a gate circuit, operatively connected between the load capacitance and the other end of said boosting capacitance, for transferring the charges held by said boosting capacitance to the load capacitance; and
   a gate control circuit, operatively connected to said gate circuit and said boosting capacitance, and operatively connectable to receive the clock signal $\phi$, for opening said gate circuit after the transfer of the charge of said boosting capacitance to the load capacitance in dependence upon the clock signal $\phi$ and for closing said gate circuit during the transfer of the charge of said boosting capacitance to the load capacitance by said gate circuit.

2. A boosting circuit as described in claim 1, wherein said boosting circuit is operatively connected to a driver circuit, and wherein said specific voltage is generated by said driver circuit.

3. A boosting circuit as described in claim 1, wherein said boosting circuit is incorporated in a driver circuit, and wherein said specific voltage is generated by an external circuit outside said driver circuit.

4. A boosting circuit as described in claim 1, wherein said charging circuit comprises a power source voltage line and a power supply circuit, operatively connected between the power source voltage line and the other end of said boosting capacitance, to supply a power source voltage to said boosting capacitance.

5. A boosting circuit as described in claim 2, wherein said gate circuit comprises a first transistor having a gate electrode, and wherein said gate control circuit comrises:
   an auxiliary capacitor one end of which is operatively connectable to receive the clock signal $\phi$ and the other end of which is connected to the gate electrode of said first transistor; and
   a second transistor operatively connected between the other end of said auxiliary capacitor and said driver circuit.

6. A boosting circuit as described in claim 5, wherein said boosting circuit includes a power source voltage line, and wherein the gate electrode of said second transistor is operatively connected to the power source voltage line.

7. A boosting circuit as described in claim 5, wherein said boosting circuit includes a power source voltage line, wherein said charging circuit comprises a third transistor which is operatively connected between the power source voltage line and the other end of said boosting capacitance, and wherein said third transistor has a gate electrode operatively connected to the power source voltage line.

8. A boosting circuit as described in claim 5, wherein a capacitance value of said auxiliary capacitor is less than a capacitance value of said boosting capacitance.

9. A boosting circuit as claimed in claims 1 or 7, wherein said boosting circuit is operatively connectable to receive a clock signal $\overline{\phi}$ and includes a voltage source line, wherein said charging circuit comprises:
   a fourth transistor operatively connected to the voltage source line;
   a fifth transistor operatively connected to the voltage source line, to the fourth transistor, and to the boosting capacitor, and operatively connected to the third transistor forming a connecting point; and
   an auxiliary charging capacitor one end of which is operatively connected to the connecting point between said third and fifth transistors, the other end of which is operatively connectable to receive the clock signal $\overline{\phi}$ having a timing difference from the clock signal $\phi$.

10. A boosting circuit commonly connected at a first node to both a driver circuit for providing a clock signal and a load capacitor, and operatively connectable to receive a delayed clock signal, comprising:
    a gate control circuit having a first input operatively connected to the first node, having a second input operatively connectable to receive the delayed clock signal and having an output;
    a gate circuit having a first input operatively connected to the output of said gate control circuit, having a second input and having an output operatively connected to the first node;
    a boosting capacitor having a first terminal operatively connected to the second input of said gate control circuit and operatively connectable to receive the delayed clock signal and having a second terminal operatively connected to the second input of said gate circuit; and
    a charging circuit having an output operatively connected to the second terminal of said boosting capacitor.

11. A boosting circuit as recited in claim 10, wherein said gate control circuit comprises:

a first transistor having a first terminal operatively connected to the first node and having a second terminal operatively connected to the first input of said gate circuit; and a first capacitor having a first terminal operatively connected to the second terminal of said first transistor and having a second terminal operatively connected to the first terminal of said boosting capacitor and operatively connectable to receive the delayed clock signal.

12. A boosting circuit as recited in claim 11, wherein said first transistor of said gate control circuit has a third terminal operatively connected to a reference voltage.

13. A boosting circuit as recited in claim 11, wherein said boosting circuit is operatively connectable to receive a bar clock signal, wherein said gate control circuit further comprises:

a second transistor having a first terminal operatively connected to a reference voltage, having a second terminal operatively connected to the third terminal of said first transistor and having a third terminal;

a first inverter circuit having a first input operatively connected to the first node, having a second input operatively connectable to receive the bar clock signal and having an output;

a second inverter circuit having a first input operatively connectable to receive the bar clock signal, having a second input operatively connected to the output of said first inverter circuit and having an output operatively connected to the third terminal of said second transistor;

a second capacitor operatively connected between the second and third terminals of said first transistor; and a third transistor having a first terminal operatively connected to the second terminal of said first transistor, having a second terminal operatively connected to ground and having a third terminal operatively connectable to receive the bar clock signal.

14. A boosting circuit as recited in claim 13, wherein said first and second inverter circuits each comprise:

a first transistor having a first terminal operatively connected to the reference voltage, having a second terminal which is the output of said inverter circuit and having a third terminal which is the first input of said inverter circuit; and a second transistor having a first terminal operatively connected to the second terminal of said first transistor, having a second terminal operatively connected to ground and having a third terminal which is the second input of said inverter circuit.

15. A boosting circuit as recited in claim 10, wherein said gate circuit comprises a transistor operatively connected to the first node, to the output of said gate control circuit and to the second terminal of said boosting capacitor.

16. A boosting circuit as recited in claim 10, wherein said charging circuit comprises a first transistor having first and second terminals operatively connected to a reference voltage.

17. A boosting circuit as recited in claim 16, wherein said first transistor of said charging circuit has a third terminal, wherein said third terminal of said first transistor is operatively connected to the second terminal of said boosting capacitor.

18. A boosting circuit as recited in claim 16, wherein said first transistor of said charging circuit has a third terminal, wherein said boosting circuit is operatively connectable to receive a bar clock signal, wherein said charging circuit further comprises:

a capacitor having a first terminal operatively connected to the third terminal of said first transistor and having a second terminal operatively connectable to receive the bar clock signal;

a second transistor having a first terminal operatively connected to the reference voltage, having a second terminal operatively connected to the third terminal of said first transistor and having a third terminal operatively connected to the second terminal of said boosting capacitor; and a third transistor having first and third terminals operatively connected to the reference voltage and having a second terminal operatively connected to the third terminal of said second transistor.

19. A boosting circuit as recited in claim 16, wherein said first transistor of said charging circuit has a third terminal, wherein said charging circuit further comprises:

a second transistor having a first terminal operatively connected to the reference voltage, having a second terminal operatively connected to the second terminal of said boosting capacitor and having a third terminal operatively connected to the third terminal of said first transistor; and a capacitance having a first terminal operatively connected to the third terminal of said second transistor and having a second terminal operatively connected to receive the bar clock signal.

* * * * *

UNITED STATES PATENT AND TRADEMARK OFFICE
CERTIFICATE OF CORRECTION

PATENT NO. : 4,382,194

DATED : May 3, 1983

INVENTOR(S) : MASAO NAKANO

It is certified that error appears in the above-identified patent and that said Letters Patent is hereby corrected as shown below:

```
    Column 1, line 24, "capacitor;" should be
--capacitor,--;
              line 32, "with" should be --with the--;
              line 45, "above" should be --alone--.

Column 3, line 28, "V_DD" should be --V_DD,--;
              line 33, "wher" should be --where--;
              line 66, "which" should be --which the--.

Column 5, line 40, "level" should be --level,--.
```

Signed and Sealed this

Fifteenth Day of November 1983

[SEAL]

Attest:

GERALD J. MOSSINGHOFF

Attesting Officer

Commissioner of Patents and Trademarks